United States Patent [19]

Padmanaban et al.

[11] Patent Number: 5,773,191
[45] Date of Patent: Jun. 30, 1998

[54] RADIATION-SENSITIVE COMPOSITION

[75] Inventors: Munirathna Padmanaban; Yoshiaki Kinoshita; Satoru Funato; Natsumi Kawasaki; Hiroshi Okazaki; Georg Pawlowski, all of Saitama, Japan

[73] Assignee: Hoechst Japan Limited, Tokyo, Japan

[21] Appl. No.: 685,850

[22] Filed: Jul. 24, 1996

[30] Foreign Application Priority Data

Jul. 26, 1995 [JP] Japan .................................... 7-211183

[51] Int. Cl.$^6$ ............................ G03F 7/004; G03F 7/032; G03F 7/30
[52] U.S. Cl. ...................... 430/270.1; 430/170; 430/325; 430/326; 430/905; 430/909
[58] Field of Search ................................ 430/270.1, 170, 430/905, 909, 325, 326

[56] References Cited

U.S. PATENT DOCUMENTS

| | | | |
|---|---|---|---|
| 4,247,611 | 1/1981 | Sander et al. ......................... | 430/270.1 |
| 4,822,719 | 4/1989 | Schneller et al. ..................... | 430/270.1 |
| 5,350,660 | 9/1994 | Urano et al. .......................... | 430/270.1 |
| 5,468,589 | 11/1995 | Urano et al. .......................... | 430/270.1 |
| 5,556,734 | 9/1996 | Yamachika et al. .................. | 430/270.1 |
| 5,558,976 | 9/1996 | Urano et al. .......................... | 430/270.1 |
| 5,595,855 | 1/1997 | Padmanaban et al. ............... | 430/270.1 |
| 5,650,262 | 7/1997 | Munzel et al. ........................ | 430/270.1 |

FOREIGN PATENT DOCUMENTS

| | | |
|---|---|---|
| 0 541 112 A1 | 5/1993 | European Pat. Off. . |
| 0 543 761 A1 | 5/1993 | European Pat. Off. . |
| 0 632 327 A1 | 1/1995 | European Pat. Off. . |
| 0 633 502 A1 | 1/1995 | European Pat. Off. . |

*Primary Examiner*—John S. Chu
*Attorney, Agent, or Firm*—Foley & Lardner

[57] ABSTRACT

A radiation-sensitive composition is disclosed which includes:

(a) a copolymer represented by the general formula:

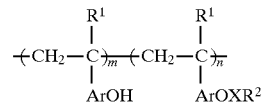

wherein $R^1$ is a hydrogen atom or a methyl group, $R^2$ is a substituted or unsubstituted alkyl group or a substituted or unsubstituted aryl group, Ar is a substituted or unsubstituted phenylene group or a substituted or unsubstituted cyclohexylene group, X is a divalent group represented by —$SO_2$— or —CO—, m and n are individually an integer not less than 1;

(b) a dissolution inhibitor composed of a compound represented by the general formula:

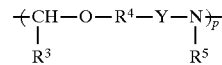

wherein $R^3$ is an alkyl group or a substituted or unsubstituted aryl group, $R^4$ is an alkylene group, a cycloalkylene group, an alkenylene group or an alkynylene group, $R^5$ is an alkyl group or an cycloalkyl group, Y is —OCO—, —CO— or —NHCO—, and p is an integer not less than 1, or (b') a cross-linking agent;

(c) a photosensitive compound capable of generating an acid when exposed to a radiation; and (e) a solvent.

19 Claims, No Drawings

RADIATION-SENSITIVE COMPOSITION

BACKGROUND OF THE INVENTION

This invention relates to a radiation-sensitive composition suitable for the manufacture of photoresists, electronic elements, printing plates or the like, or usable in a chemical milling process.

In recent semiconductor-chip manufacturing processes, the chip dimensions are increasingly reduced. In consequence, there is a demand for improved lithographic techniques which is utilizable in the production of a chip having fine structures of less than half-micron. Such improved lithographic techniques known in the art have used an exposure means such as those using a high-energy ultraviolet light, an electron beam, an X-ray or the like. In addition, the improved lithographic techniques have caused change in requirements for properties or characteristics of a radiation-sensitive (resist) mixture used therein. For example, the requirements therefor have been documented in C. G. Wilson, "Organoresist Material-Theory and Chemistry" in the literature "Micro-Lithography Guidance; Theory, Material and Treatment" (L. F. Thompson, C. G. Wilson and M. J. Bowden ASC Symp. Ser., 219: 87 (1983), American Chemical Society, Washington). Pursuant to the documented article, there has been a strong demand for a radiation-sensitive mixture exhibiting a sensitivity to a light with a wide spectral range and applicable to not only conventional photolithographic techniques but also recent improved techniques in which a middle ultra-violet light (mid UV) or a deep ultra-violet light (deep UV), an electron beam or an X-ray is used.

In order to produce such a radiation-sensitive mixture exhibiting a high sensitivity to a high-energy radiation, a chemically amplified resist has been widely used. Such a radiation-sensitive mixture is first disclosed in H. Ito and C. G. Wilson, "Polym. Eng. Sci.," Vol. 23, 1012 (1983). Generally, individual protons generated upon exposure to radiation are caused to react catalytically with the radiation-sensitive mixture at room or higher temperature depending on its chemical composition. This catalytic reaction imparts a high sensitivity to the radiation-sensitive mixture.

In semiconductor industries, it has been assumed that the radiation-sensitive mixture (hereinafter referred to merely as "resist mixture") must be developed by using an alkali solution. The alkali solution is suitably an organic base solution such as an aqueous solution containing 2 to 3% by weight of tetramethyl ammonium hydroxide (TMAH).

In order to render the resist mixture developable with such an alkali solution, it is most desirable that the resist mixture contains a novolak resin or a homopolymer or copolymer of vinylphenol. In photolithography, the use of the novolak resin is limited to the case where a radiation having a wave length greater than 300 nm is used, because the resin exhibits a high absorption to those having a short wave length. That is, the high absorption of the novolak resin adversely affects the quality of the resist mixture, resulting in bad profiles. On the other hand, a vinylphenol resin can be used in a deep UV lithography only in the case where it has a desired dissolution characteristic and high optical transparency. Poly(4-vinylphenol) exhibits a considerably high solubility when used as such, and therefore is unsuitable for such a use per se.

Moreover, in case poly(4-vinylphenol) is used along with poly(N, O-acetal) as a dissolution inhibitor in a three-component resist material, there is obtained only a pattern of line and space (hereinafter referred to as "L/S") having surface roughness. One method for reducing the solubility to a desired level is by copolymerizing 4-vinylphenol with other alkyl-substituted vinylphenol. Such copolymers are disclosed in European patent application laid-open publications Nos. 307,752 and 307,751, and Japanese patent application laid-open publication No. 2-166,105 (1990). Other copolymers of 4-hydroxystyrene are disclosed in "Basis and Application of Vinylphenol," (1991) p. 71 by Maruzen Petrochemical Company.

Essentially, there is known two methods in which poly-(4-vinylphenol) or a copolymer thereof soluble in an alkali solution is used as the resist mixture. The first method includes completely or partly introducing protective groups capable of being cleaved in the presence of an acid into the hydroxyl groups of the polymer or copolymer to render it soluble in an alkali solution. In this method, a mixture of such a protected polymer or copolymer and a photo-acid-generating agent described below is first produced. The mixture is exposed to a radiation to generate an acid so that a protective group having a sensitivity to the acid, is released from the hydroxyl group.

The protective groups used in the afore-mentioned first method include a t-butyloxycarbonyloxy group and derivatives thereof (Ito et al., "J. Photopolym. Sci. & Tech.," Vol. 6, No. 4 (1993) p. 547), or a tetrahydropyranyl group (Hattori et al., "J. Photopolym. Sci. & Tech.," Vol. 6, No. 4 (1993) p. 497). The second method uses a dissolution inhibitor such as polyacetal, which is sensitive to an acid, a photo-acid-generating agent and poly(4-vinylphenol) are mixed together, as disclosed in Pawlowski et al., "J. Photopolym. Sci. & Tech.," Vol. 15, No. 1 (1992) p. 55. The mixture is insoluble in an aqueous alkali developer before exposure to a light. However, when exposed to a deep ultra-violet light, the photo-acid-generating agent releases an acid so that the mixture is rendered soluble in the aqueous alkali developer since the dissolution inhibitor is decomposed by the acid.

In addition, there are known photo-acid-generating agents, which is a compound capable of generating a strong acid upon exposure to the light radiation, such as a diazonium salt, a phosphonium salt, sulfonium salt of non-nucleophilic acid such as $HSbF_6$ or $HAsF_6$ as disclosed in J. V. Crivello, "Polym. Eng. Sci." Vol. 23 (1983) p. 953. Moreover, other compounds known as photo-acid-generating agents include halogen compounds such as, especially, trichloromethyltriazine derivatives or trichloromethyloxadiazole derivatives, o-quinonediazidosulfochloride, o-quinonediazido-4-sulfonic acid ester, a mixture of an organic metal and an organic halogen, bis(sulfonyl) diazomethane, sulfonylcarbonyldiazomethane (refer to DE-A 3,930,087) or nitrobenzyltosylate, as disclosed in F. M. Houlihan et al., "SPIE Proc., Adv. in Resist Tech. and Proc.," Vol. 920 (1988) p. 67.

It is further possible to add additives to the resist mixture to enhance contrast, delay time stability and prevent reduction in the line width thereof. In addition, a particular solvent capable of dissolving entire components of the resist mixture is used to enable film-casting thereof on a substrate of the semiconductor.

SUMMARY OF THE INVENTION

It is, therefore, an object of the present invention to provide a radiation-sensitive composition of a positive-type or a negative-type having a high transparency to a radiation, especially such as deep ultra-violet light, an electron beam or a KrF-excimer-laser beam and a high sensitivity to a these radiation and an X-ray when exposed, and exhibiting an excellent heat resistance whereby a pattern can be obtained with a high accuracy but without change in dimension thereof with an elapsed time, and a pattern having a size less than 0.3 μm can be obtained without exhibiting standing waves.

In accordance with a first aspect of the present invention, there is provided a positive-type radiation-sensitive composition comprising:

(a) a copolymer represented by the general formula (I):

where $R^1$ is a hydrogen atom or a methyl group, $R^2$ is an alkyl group or a substituted or unsubstituted aryl group, Ar is a substituted or unsubstituted phenylene group or a substituted or unsubstituted cyclohexylene group, X is a divalent group represented by $-SO_2-$ or $-CO-$, m and n are individually an integer not less than 1;

(b) a dissolution inhibitor composed of a compound represented by the general formula (II):

wherein $R^3$ is an alkyl group or a substituted or unsubstituted aryl group, $R^4$ is an alkylene group, a cycloalkylene group, an alkenylene group or an alkynylene group, $R^5$ is an alkyl group or a cycloalkyl group, Y is $-OCO-$, $-CO-$ or $-NHCO-$, and p is an integer not less than 1;

(c) a photosensitive compound capable of generating an acid when exposed to a radiation; and (e) a solvent.

In a second aspect of the present invention, there is provided a negative-type radiation-sensitive composition comprising:

(a) a copolymer represented by the general formula (I):

where $R^1$ is a hydrogen atom or a methyl group, $R^2$ is an alkyl group or a substituted or unsubstituted aryl group, Ar is a substituted or unsubstituted phenylene group or a substituted or unsubstituted cyclohexylene group, X is a divalent group represented by $-SO_2-$ or $-CO-$, m and n are individually an integer not less than 1;

(b') a cross-linking agent;

(c) a photosensitive compound capable of generating an acid when exposed to a radiation; and (e) a solvent.

The radiation-sensitive composition according to the present invention may further include a base capable of being decomposed when exposed to a radiation to form a neutral compound derived therefrom. The radiation-sensitive composition according to the present invention may be applied to a base film to obtain a resist film. The resist film is selectively exposed to a light and thereafter is subjected to heating and developing treatments to obtain a pattern thereon. Development of the positive-type resist film is carried out by removing an exposed portion thereof while development of the negative-type film is carried out by removing unexposed portion thereof.

The above and other features and objects of the present invention will become more apparent from the following detailed description and the appended claims.

DETAILED DESCRIPTION OF THE PREFERRED EMBODIMENTS OF THE INVENTION

The copolymer (component (a)) used in the radiation-sensitive composition according to the present invention, includes those represented by the general formula (I):

where $R^1$ is a hydrogen atom or a methyl group, $R^2$ is an alkyl group or a substituted or unsubstituted aryl group, Ar is a substituted or unsubstituted phenylene group or a substituted or unsubstituted cyclohexylene group, X is a divalent group represented by $-SO_2-$ or $-CO-$, m and n are individually an integer not less than 1.

In the general formula (I), the radical $R^2$ is preferably a linear or branched alkyl group having 1 to 15 carbon atoms or an aryl group having 6 to 12 carbon atoms with or without substituent group(s). In addition, the suitable substituent of $R^2$ and Ar may be, for example, an alkyl group.

Typical examples of the copolymers represented by the general formula (I) may include a copolymer of 4-methylsulfonyloxystyrene and 4-hydroxystyrene, a copolymer of 4-ethylsulfonyloxystyrene and 4-hydroxystyrene, a copolymer of 4-propylsulfonyloxystyrene and 4-hydroxystyrene, a copolymer of 4-butylsulfonyloxystyrene and 4-hydroxystyrene, a copolymer of 4-methylcarbonyloxystyrene and 4-hydroxystyrene, a copolymer of 4-ethylcarbonyloxystyrene and 4-hydroxystyrene, a copolymer of 4-butylcarbonyloxystyrene and 4-hydroxystyrene, or the like.

The molar ratio of the alkylsulfonyloxystyrene to the hydroxystyrene may be in the range of 1/99 to 99/1, preferably 5/95 to 40/60. In the event that the copolymer is used in the three component system, it is preferred that the molar ratio is not less than 40/60. This is because the dissolution rate of the copolymer in an alkali developer solution is too low (less than 300 nm/min.) when the molar ratio of the alkylsulfonyloxystyrene to the hydroxystyrene exceeds 40/60. A molecular weight of the copolymer may be in the range of 1,000 to 100,000 (doltons), preferably 5,000 to 15,000 (doltons).

The dissolution inhibitor (component (b)) used in the radiation-sensitive composition of the present invention may be the compound having the repeating unit represented by the general formula (II):

wherein $R^3$ is an alkyl group or a substituted or unsubstituted aryl group, $R^4$ is an alkylene group, a cycloalkylene group, an alkenylene group or an alkynylene group, $R^5$ is an alkyl group or a cycloalkyl group, Y is $-OCO-$, $-CO-$ or $-NHCO-$, and p is an integer not less than 1.

In the general formula (II), the radical $R^3$ is preferably an alkyl group having 1 to 15 carbon atoms, an aryl group having 6 to 20 carbon atoms with or without substituent group(s). More preferably, the radical $R^3$ is a substituted or unsubstituted aryl group such as substituted or unsubstituted benzene or naphthalene. The substituent of the aryl group may include, for example, an alkyl group. The radical $R^4$ is preferably an alkylene group having 2 to 15 carbon atoms, a cycloalkylene group having 3 to 10 carbon atoms or an alkenylene or alkynylene group having 4 to 15 carbon atoms. In addition, the radical $R^5$ is preferably an alkyl group having 1 to 15 carbon atoms or a cycloalkyl group having 6 to 15 carbon atoms.

Particularly preferred compounds as the dissolution inhibitor may be those represented by the general formula (II) in which $R^4$ is an ethylene group, an isopropylene group or a branched butylene group, $R^3$ is a phenyl group or an alkyl-substituted phenyl group, and $R^5$ is a propyl group or a group represented by —OCO—.

The compounds represented by the general formula (II) are generally referred to as "poly(N,O-acetal)." Such a polyacetal may be produced by subjecting an urethane-alcohol component and aldehyde dimethylacetal to an ester interchange reaction in the presence of an acid catalyst. The condensation degree and molecular weight distribution thereof is controlled by varying its polycondensation conditions.

In the event that the radiation-sensitive composition according to the present invention is used in the form of a negative-type resist, the dissolution inhibitor agent (component (b)) may be replaced with a cross-linking agent (component (b')). The cross-linking agent may be a compound capable of being cross-linked with the copolymer (a) when or after the composition is exposed to a radiation. Particularly preferred cross-linking agent is hexamethylmelamine or derivatives thereof. It is advantageous that the cross-linking agent exhibits no absorption to an ultra-violet light, especially to those having a wave length of about 248 nm.

The photosensitive compound (component (c)) is those capable of generating an acid when exposed to a radiation. Examples of the suitable photosensitive compounds include a diazomethane compound, an iodonium salt, a sulfonium salt, a halogen compound or an o-quinone-diazidosulfonic acid ester. The preferred photosensitive compound is a comound capable of generating a sulfonic acid and having a proper thermal stability and an advantageous absorption to a radiation beam having a wave length of preferably 220 to 380 nm, particularly 248 nm. Examples of such photosensitive compounds may include a phenol-based sulfonic acid ester, bis-sulfonylmethane and bis-sulfonyldiazomethane. Above all, particularly preferred are sulfonic acid-sulfonium compounds and bis(4-chlorophenylsulfonyl)diazomethane. Illustrative of suitable sulfonic acid-sulfonium compounds are triarylsulfonium alkylsulfonates, e.g. triphenylfonium alkylsulfonates; triarylsulfonium halogen-substituted-alkylsulfonates, e.g. triphenylsulfonium fluorinated alkylsulfonates; triarylsulfonium arylsulfonates, e.g. triphenylsulfonium arylsulfonates; and triarylsulfonium halogen- or alkyl-substituted-arylsulfonates, e.g. triphenylsulfonium arylsulfonate.

The preferred photosensitive compounds (c) include those represented by the general formulas (III) or (IV):

where Ar and Ar' are independently a phenyl group, a chlorophenyl group, a tolyl group, an alkyl group or the combination thereof, $R^6$ is an alkyl group or a fluorinated alkyl group, and Z is a group represented by —SO$_2$— or —CO—.

In accordance with the present invention, the radiation-sensitive composition may further comprise a photosensitive base as an optional component (d). The photosensitive base is useful to control a line width of patterns to be formed. Particularly useful compounds as the photosensitive base may include triphenylsulfonium hydroxide or derivatives thereof, or diphenyliodonium hydroxide or derivatives thereof. The amount of the photosensitive base used in the radiation-sensitive composition varies depending upon the absorption thereof and the amount of the afore-mentioned acid-generating component (c).

Particularly preferred photosensitive base may include those represented by the general formulas (V) or (VI):

where Ar has the same meaning as defined previously with regard to the general formulae (III) and (IV).

The solid content of the radiation-sensitive composition, which is equal to a total content of the components (a) to (d), is in the range of 10 to 50% by weight, preferably 15 to 25% by weight based on a total amount of the radiation-sensitive composition. The weight ratio of the component (a) to the component (b) or (b') is in the range of 95:5 to 50:50, depending upon the molecular weights of the components (a) and (b) or (b') and the solubility of the component (a) in an aqueous alkali developer. When the thus-constructed radiation-sensitive composition is applied to a pattern formation in manufacture of a semiconductor, a film composed of such a radiation-sensitive composition can be uniformly coated over a substrate wafer such as silicon.

In addition, the weight ratio of the copolymer (component (a)) to the dissolution inhibitor (component (b)) is suitably determined depending upon the dissolution rate of the copolymer in an alkali solution. The preferred weight ratio of the component (a) to the component (b) is in the range of 80:20 to 60:40.

The amount of the photosensitive compound (component (c)) is in the range of 0.2 to 5% by weight, preferably 1 to 3% by weight, based on a total amount of the components (a) and (b). The required amount of the photosensitive base (component (d)) is determined by the amount of component (c). Generally, the mole amount of component (d) is equal to or less than that of component (c).

The solvent (component (e)) is not restricted to particular ones as far as the solvent can dissolve the components (a), (b) or (b'), (c) and (d). From the standpoint of safety, solubility, boiling point and film-formation, examples of preferred solvents may include propylene glycol monomethyl ether acetate (PGMEA), ethyl lactate (EL) Cellosolve acetate or the like. Particularly preferred solvent is propylene glycol monomethyl ether acetate (PGMEA).

In the radiation-sensitive composition according to the present invention, each of the components (a), (b) or (b'), (c) and (d) is used singly or in the form of a mixture of two or more different compounds.

The radiation-sensitive composition according to the present invention can be used for pattern formation in the manufacture of semiconductor devices. In this case, the pattern formation is performed as follows.

First, the radiation-sensitive composition according to the present invention, is coated over a substrate such as a silicon wafer to form a film thereof having a thickness of 500 to 2,000 nm. The film is placed in an oven and then heated at 60° to 150° C. for 10 to 30 minutes. Alternatively, the film is placed on a hot plate and then baked at 60° to 150° C. for 1 to 2 minutes. The resultant resist film is masked with a masking material for forming a desired pattern thereon. The masked resist film is then exposed to a deep ultra-violet light having a wave length of 300 nm or less at an exposure amount (energy) of about 1 to 100 mJ/cm². Subsequently, the deep UV-exposed film is developed with a developer solution such as an aqueous solution containing 0.1 to 5% of tetramethyl ammonium hydroxide for 0.5 to 3 minutes by using an immersing method, a spraying method, a puddle-applying method or other usual methods, whereby the desired pattern is formed on the substrate.

The present invention will be described in more detail below by way of examples but the examples are only illustrative and not intended to limit the scope of the present invention. Further, percentages appearing through the examples are indicated on the weight basis.

REFERENCE EXAMPLE 1

Synthesis of Copolymer (1) (Copolymer of 4-methyl-sulfonyloxystyrene and 4-hydroxystyrene)

50 g (0.416 mole) of poly-(4-hydroxystyrene) (PHS; manufactured by Hoechst Cellanese Co. and having a weight-average molecular weight of 15,100 as measured by using a polystyrene standard sample) was added to 200 ml of tetrahydrofuran placed in a three-necked flask equipped with a reflux condenser, a dropping funnel and an agitator, and dissolved therein. After adding 2.146 g of triethylamine, the reaction mixture solution in the flask was cooled to 10° C. or lower temperature in an ice bath. 2.405 g (0.021 mole; 5 mole % relative to poly-(4-hydroxystyrene)) of methyl-sulfonyl chloride was dropped into the solution for 15 minutes while agitating. The agitation was continued for 3 hours or more. The resultant concentrated viscous solution was diluted with additional 200 ml of tetrahydrofuran. The dilute solution was subjected to precipitation with a distilled water, filtered and washed with 2 liters of water two times, followed by further filtering and then drying at 50° C. under a reduced pressure (1 Torr). It was confirmed that a yield of the resultant copolymer was 51 g (98.8%).

The resultant copolymer exhibited an infrared spectrum having a peak at 1765 cm⁻¹. As a result of an infrared quantitative analysis, it was confirmed that 5 mole % of hydroxyl groups of the 4-hydroxystyrene polymer was converted to a methylsulfonyloxy group. A solution of the polymer in propylene glycol monomethyl ether acetate (PGMEA) was spin-coated over a silicon substrate to form a film having a thickness of 1 μm. A dissolution rate (DR) of the film in a 0.24N tetramethylammonium hydroxide solution was measured by using a dissolution rate monitor. As a result, it was confirmed that the dissolution rate was 7161 nm/minutes.

REFERENCE EXAMPLES 2–8

Procedures of Reference Example 1 were repeated in the same manner as described above to produce Copolymers (2) to (8) except the amounts of alkylsulfonyl chloride and triethylamine were changed to those enumerated in Table 1. The results are shown in Table 1. As will be understood from Table 1, the dissolution rate of the copolymer was decreased as the content of the alkylsulfonyloxy group in the copolymer became large.

TABLE 1

| Copolymer No. | RSO₂Cl | Mol % of RSO₂Cl | Mol % of Tri-ethylamine | Dissolution Rate (nm/min.) |
|---|---|---|---|---|
| (1) | MSC(1) | 5 | 5 | 7161 |
| (2) | " | 10 | 10 | 4872 |
| (3) | " | 15 | 15 | 2600 |
| (4) | " | 20 | 20 | 1356 |
| (5) | " | 40 | 40 | 309 |
| (6) | " | 100 | 100 | undissolved |
| (7) | PSC(2) | 10 | 10 | 2232 |
| (8) | BSC(3) | 10 | 10 | 1470 |

Note:
(1)The abbreviation "MSC" represents methylsulfonyl chloride;
(2)The abbreviation "PSC" represents propylsulfonyl chloride; and
(3)The abbreviation "BSC" represents butylsulfonyl chloride.

REFERENCE EXAMPLE 9

Synthesis of Copolymer (9) (Copolymer of 4-methylcarbonyloxystyrene and 4-hydroxystyrene)

The procedure of Reference Example 1 was repeated in the same manner as described above to produce a copolymer (9) except that 1.635 g (0.621 mole; 5 mol % relative to poly-(4-hydroxystyrene)) of methylcarbonyl chloride was used instead of methylsulfonyl chloride. The resultant copolymer exhibited an infrared spectrum having a peak at 1763 cm⁻¹. As a result of an infrared quantitative analysis, it was confirmed that a content of a methylcarbonyloxy group in the copolymer was 5 mole %. The dissolution rate (DR) of the film in a 0.24N tetramethylammonium hydroxide solution was measured by using the dissolution rate monitor. As a result, it was confirmed that the dissolution rate was 7722 nm/minutes.

REFERENCE EXAMPLES 10–14

The procedures of Reference Example 9 were repeated in the same manner as described above to produce Copolymers (10) to (14) except that the amounts of alkylcarbonyl chloride and triethylamine were changed to those enumerated in Table 2. As will be understood from Table 2, the dissolution rate of the copolymer was decreased as a content of the alkylcarbonyloxy group in the copolymer became large.

TABLE 2

| Copolymer No. | RCOCl | Mol % of RCOCl | Mol % of Triethylamine | Dissolution Rate (nm/min.) |
|---|---|---|---|---|
| (9) | MCC(1) | 5 | 5 | 7722 |
| (10) | " | 10 | 10 | 4056 |
| (11) | " | 15 | 1.5 | 2040 |
| (12) | " | 20 | 20 | 1014 |
| (13) | ECC(2) | 10 | 10 | 3012 |
| (14) | BCC(3) | 10 | 10 | 1404 |

Note:
(1)The abbreviation "MCC" represents methylcarbonyl chloride;
(2)The abbreviation "ECC" represents ethylcarbonylchloride; and
(3)The abbreviation "BCC" represents butylcarbonyl chloride.

REFERENCE EXAMPLE 15

(a) Synthesis of Starting material A (N-propyl-2-hydroxyethylcarbamate):

59.11 g of n-propylamine was gradually dropped in 88.062 g of ethylene carbonate at 0° C. through one hour. The mixture was agitated at 0° C. for one hour and then heated at 70° C. to react both the compounds for 5 hours.

The resultant viscous liquid reaction product was distilled at 110° C. under a reduced pressure of 0.06 millibar. The yield of N-propyl-2-hydroxyethylcarbamate (compound A) was 142.75 g (97%).

(b) Synthesis of Polyacetal (1):

73.58 g of the compound A, 76.1 g of benzaldehydedimethylacetal and 300 milliliters of o-xylene were mixed in a flask connected to a distillation apparatus for removing an azeotropic mixture of methanol and xylene and equipped with a dropping funnel. 5 g of a sulfonic acid-containing ion exchange resin (Amberlyst 15) was added into the mixture which was then gradually heated to 130° C. With the increase of the reaction temperature, methanol was generated as a by-product which was removed in the form of the azeotropic mixture with xylene from the reaction mixture. In order to maintain a constant content of xylene in the reaction mixture, an additional amount of xylene was added to the reaction mixture. After the reaction had been continued for 6 hours, the reaction mixture was cooled to room temperature and filtered to remove the ion exchange resin (Amberlyst 15). The residual xylene was evaporated by using a rotary evaporator, which resulted in obtaining a high-viscosity liquid oligomer having a weight-average molecular weight of about 2,000 as measured by gel permeation chromatography (GPC) method in which a polystyrene standard sample was used as a reference. The thus-obtained oligomer was further heated at 200° C. for 3 hours under a reduced pressure of 0.001 Torr. As a result, the total amount of poly(N,O-acetal) obtained was 101.6 g (yield: 90%). The weight-average molecular weight of poly (N,O-acetal) was 7000 when measured by gel permeation chromatography (GPC) method in which a polystyrene standard sample was used as a reference. Meanwhile, it was confirmed that a molecular weight of the final reaction product varied dependent upon the reaction temperature and the reaction time. Namely various polyacetals (1) having different molecular weights were easily produced by changing the reaction temperature and the reaction time.

REFERENCE EXAMPLE 16

(a) Synthesis of Starting Material B:

102.09 g of 4-methyl-1, 3-dioxolane-2-one and 59.11 g of propylamine were reacted with each other in the same manner as described above in the synthesis of the compound A. The reaction product showed a boiling point of 114° to 115° C. at 0.4 Torr. The yield of the reaction product was 99% (159.6 g).

(b) Synthesis of polyacetal (2):

The compound B obtained above and 97.13 g of p-isopropyl-benzaldehyde-dimethylacetal were reacted with each other in the same manner as described above in the synthesis of the polyacetal (1). The thus-obtained polyacetal (2) had a molecular weight of 6,500 and the yield of the polyacetal (2) was 90%.

EXAMPLE 1

A resist mixture composed of the following components was prepared:

| | |
|---|---|
| Copolymer (2) prepared in Reference Example 2 | 6.30 g |
| Polyacetal (2) prepared in Reference Example 16 | 2.73 g |
| Triphenylsulfonium hexafluoropropylsulfonate | 0.205 g |
| Propylene glycol monomethyl ether acetate (PGMEA) solution of 0.1 mmol/g triphenylsulfonium acetate | 4.2 g |
| PGMEA | 32 g |

The mixture was stirred for one hour or more and then filtered by using in turn 0.5 $\mu$m- and 0.2 $\mu$m-filters to remove particles. The thus-obtained resist solution was spin-coated on a silicon wafer or any other semiconductor substrate, and thereafter pre-baked at 130° C. for 60 seconds to obtain a film-like resist material having a thickness of 0.71 $\mu$m. The surface of the silicon wafer coated with the resist material was selectively exposed to a KrF excimer-laser beam having a wave length of 248.4 nm by using a mask. The exposed resist material was baked on a hot plate at 55° C. for 90 seconds, and then developed for 60 seconds with an alkali developer solution (containing 2.38% by weight of tetramethyl ammonium hydroxide) to dissolve an exposed portion of the resist material and remove it from the silicon substrate. As a result, a positive pattern was obtained on the silicon substrate. The thus-obtained positive pattern had an aspect ratio of almost 90°, a resolution of 0.24 $\mu$m in line and space and an exposure energy of 30 mJ/cm$^2$.

EXAMPLE 2

The procedure of Example 1 was repeated in the same manner as described above except that the below-mentioned constituents were used to prepare a resist mixture.

| | |
|---|---|
| Copolymer (2) prepared in Reference Example 2 | 6.30 g |
| Polyacetal (1) prepared in Reference Example 15 | 2.73 g |
| Triphenylsulfonium hexafluoropropylsulfonate | 0.205 g |
| PGMEA solution of 0.1 mmol/g triphenylsulfonium acetate | 4.2 g |
| PGMEA | 32 g |

The thus-obtained positive pattern had an aspect ratio of 90°, a resolution of 0.28 $\mu$m in line and space and an exposure energy of 35 mJ/cm$^2$.

EXAMPLE 3

The procedure of Example 1 was repeated in the same manner as described above except that the below-mentioned constituents were used to prepare a resist mixture.

| | |
|---|---|
| Copolymer (3) prepared in Reference Example 3 | 6.30 g |
| Polyacetal (1) prepared in Reference Example 15 | 2.73 g |
| Triphenylsulfonium hexafluoropropylsulfonate | 0.205 g |
| PGMEA solution of 0.1 mmol/g triphenylsulfonium acetate | 4.2 g |
| PGMEA | 32 g |

The thus-obtained positive pattern had an aspect ratio of about 87°, a resolution of 0.28 $\mu$m in line and space and an exposure energy of 35 mJ/cm$^2$.

EXAMPLE 4

The procedure of Example 1 was repeated in the same manner as described above except that the below-mentioned constituents were used to prepare a resist mixture.

| | |
|---|---|
| Copolymer (4) prepared in Reference Example 4 | 6.30 g |
| Polyacetal (2) prepared in Reference Example 16 | 2.73 g |
| Triphenylsulfonium hexafluoropropylsulfonate | 0.205 g |
| PGMEA solution of 0.1 mmol/g triphenylsulfonium acetate | 4.2 g |
| PGMEA | 32 g |

The thus-obtained positive pattern had an aspect ratio of about 87°, a resolution of 0.4 $\mu$m in line and space and an exposure energy of 45 mJ/cm$^2$.

EXAMPLE 5

The procedure of Example 1 was repeated in the same manner as described above except that the below-mentioned constituents were used to prepare a resist mixture.

Copolymer (7) prepared in

| | |
|---|---|
| Reference Example 7 | 6.30 g |
| Polyacetal (2) prepared in Reference Example 16 | 2.73 g |
| Triphenylsulfonium hexafluoropropylsulfonate | 0.205 g |
| PGMEA solution of 0.1 mmol/g triphenylsulfonium acetate | 4.2 g |
| PGMEA | 32 g |

The thus-obtained positive pattern had an aspect ratio of about 87°, a resolution of 0.26 $\mu$m in line and space and an exposure energy of 44 mJ/cm$^2$.

EXAMPLE 6

The procedure of Example 1 was repeated in the same manner as described above except that the below-mentioned constituents were used to prepare a resist mixture.

| | |
|---|---|
| Copolymer (8) prepared in Reference Example 8 | 6.30 g |
| Polyacetal (2) prepared in Reference Example 16 | 2.73 g |
| Triphenylsulfonium hexafluoropropylsulfonate | 0.205 g |
| PGMEA solution of 0.1 mmol/g triphenylsulfonium acetate | 4.2 g |
| PGMEA | 32 g |

The thus-obtained positive pattern had an aspect ratio of about 87°, a resolution of 0.28 $\mu$m in line and space and an exposure energy of 30 mJ/cm$^2$.

EXAMPLE 7

The procedure of Example 1 was repeated in the same manner as described above except that the below-mentioned constituents were used to prepare a resist mixture.

| | |
|---|---|
| Copolymer (10) prepared in Reference Example 10 | 6.30 g |
| Polyacetal (2) prepared in Reference Example 16 | 2.73 g |
| Triphenylsulfonium hexafluoropropylsulfonate | 0.205 g |
| PGMEA solution of 0.1 mmol/g triphenylsulfonium acetate | 4.2 g |
| PGMEA | 32 g |

The thus-obtained positive pattern had an aspect ratio of about 87°, a resolution of 0.24 $\mu$m in line and space and an exposure energy of 40 mJ/cm$^2$.

EXAMPLE 8

The procedure of Example 1 was repeated in the same manner as described above except that the below-mentioned constituents were used to prepare a resist mixture.

| | |
|---|---|
| Copolymer (11) prepared in Reference Example 11 | 6.30 g |
| Polyacetal (2) prepared in Reference Example 16 | 2.73 g |
| Triphenylsulfonium hexafluoropropylsulfonate | 0.205 g |
| PGMEA solution of 0.1 mmol/g triphenylsulfonium acetate | 4.2 g |
| PGMEA | 32 g |

The thus-obtained positive pattern had an aspect ratio of about 85°, a resolution of 0.3 $\mu$m in line and space and an exposure energy of 55 mJ/cm$^2$.

EXAMPLE 9

The procedure of Example 1 was repeated in the same manner as described above except that the below-mentioned constituents were used to prepare a resist mixture.

| | |
|---|---|
| Copolymer (13) prepared in Reference Example 13 | 6.30 g |
| Polyacetal (2) prepared in Reference Example 16 | 2.73 g |
| Triphenylsulfonium hexafluoropropylsulfonate | 0.205 g |
| PGMEA solution of 0.1 mmol/g triphenylsulfonium acetate | 4.2 g |
| PGMEA | 32 g |

The thus-obtained positive pattern had an aspect ratio of about 88°, a resolution of 0.26 $\mu$m in line and space and an exposure energy of 50 mJ/cm$^2$.

EXAMPLE 10

The procedure of Example 1 was repeated in the same manner as described above except that the below-mentioned constituents were used to prepare a resist mixture.

| | |
|---|---|
| Copolymer (14) prepared in Reference Example 14 | 6.30 g |
| Polyacetal (2) prepared in Reference Example 16 | 2.73 g |
| Triphenylsulfonium hexafluoropropylsulfonate | 0.205 g |

| PGMEA solution of 0.1 mmol/g triphenylsulfonium acetate | 4.2 g |
|---|---|
| PGMEA | 32 g |

The thus-obtained positive pattern had an aspect ratio of about 88°, a resolution of 0.26 μm in line and space and an exposure energy of 40 mJ/cm².

EXAMPLE 11

A resist mixture composed of the following components was prepared:

| Copolymer (1) prepared in Reference Example 1 | 8.0 g |
|---|---|
| Hexamethoxymethylmelamine | 2.0 g |
| Triphenylsulfonium trifluoromethylsulfonate | 0.5 g |
| PGMEA | 40 g |

The thus-prepared mixture solution was stirred and filtered by using in turn 0.5 μm- and 0.2 μm-filters. The solution was spin-coated on a silicon wafer at a spinning rate of 4,000 r.p.m., and thereafter the coated wafer was prebaked at 130° C. for 60 seconds to obtain thereon a film-like resist layer having a thickness of 0.7 μm. The surface of the silicon wafer with the resist layer was selectively exposed to an electron beam radiated at an accelerating voltage of 30 KeV by using an electron accelerator. The electron-exposed resist layer was baked on a hot plate at 90° C. for 60 seconds, and then developed for 60 seconds with an alkali developer solution (containing 2.38% by weight of tetramethyl ammonium hydroxide) to dissolve only a non-exposed portion of the resist layer and remove it from the silicon substrate. As a result, a negative pattern was obtained on the silicon substrate. The thus-obtained negative pattern had an aspect ratio of about 88°, a resolution of 0.20 μm in line and space and a sensitivity of 20 μC/cm².

EXAMPLE 12

The procedure of Example 11 was repeated in the same manner as described above except that the below-mentioned components were used to prepare a resist mixture.

| Copolymer (9) prepared in Reference Example 9 | 7.5 g |
|---|---|
| Hexamethoxymethylmelamine | 2.5 g |
| Triphenylsulfonium hexafluoropropanesulfonate | 0.5 g |
| PGMEA | 40 g |

The thus-obtained negative pattern of the resist material had an aspect ratio of 90°, a resolution of 0.20 μm in line and space and a sensitivity of 30 μC/cm².

As described above, the radiation-sensitive composition according to the present invention is superior in resolution, heat resistance and a resistance to etching agent, whereby the composition is extremely suitable for applications to a semiconductor manufacturing process in which a pattern in the form of printed line and space having a size less than submicrons can be formed on a substrate such as a silicon wafer by using a KrF excimer-laser beam.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A positive-working radiation-sensitive composition comprising:

(a) a copolymer represented by the general formula:

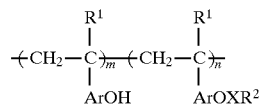

wherein $R^1$ is a hydrogen atom or a methyl group, $R^2$ is an alkyl group or a substituted or unsubstituted aryl group, Ar is a substituted or unsubstituted phenylene group or a substituted or unsubstituted cyclohexylene group, X is a divalent group represented by —SO$_2$— or —CO—, and m and n are individually an integer not less than 1;

(b) a dissolution inhibitor composed of a compound represented by the general formula:

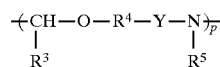

wherein $R^3$ is an alkyl group or a substituted or unsubstituted aryl group, $R^4$ is an alkylene group, a cycloalkylene group, an alkenylene group or an alkynylene group, $R^5$ is an alkyl group or a cycloalkyl group, Y is —OCO—, —CO— or —NHCO—, and p is an integer not less than 1;

(c) a photosensitive compound capable of generating an acid when exposed to a radiation; and (e) a solvent.

2. A negative-working radiation-sensitive composition comprising:

(a) a copolymer represented by the general formula:

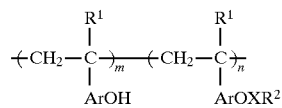

wherein $R^1$ is a hydrogen atom or a methyl group, $R^2$ is an alkyl group or a substituted or unsubstituted aryl group, Ar is a substituted or unsubstituted phenylene group or a substituted or unsubstituted cyclohexylene group, X is a divalent group represented by —SO$_2$— or —CO—, and m and n are individually an integer not less than 1;

(b') a cross-linking agent;

(c) a photosensitive compound capable of generating an acid when exposed to a radiation; and (e) a solvent.

3. The radiation sensitive composition according to claim 1, further comprising a base (d) capable of being decomposed when exposed to a radiation to produce a neutral compound derived therefrom.

4. The radiation sensitive composition according to claim 2, further comprising a base (d) capable of being decomposed when exposed to a radiation to produce a neutral compound derived therefrom.

5. The radiation-sensitive composition according to claim 1, wherein said copolymer has the general formula:

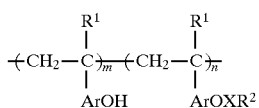

wherein $R^1$ is a hydrogen atom or a methyl group, $R^2$ is a methyl group, an ethyl group, a propyl group or a butyl group, Ar is a substituted or unsubstituted phenylene group, X is —$SO_2$—, and m and n are individually an integer not less than 1.

6. The radiation-sensitive composition according to claim 2, wherein said copolymer has the general formula:

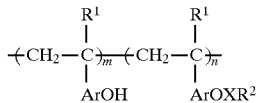

wherein $R^1$ is a hydrogen atom or a methyl group, $R^2$ is a methyl group, an ethyl group, a propyl group or a butyl group, Ar is a substituted or unsubstituted phenylene group, X is —$SO_2$—, and m and n are individually an integer not less than 1.

7. The radiation-sensitive composition according to claim 2, wherein said copolymer has the general formula:

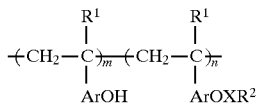

wherein $R^1$ is a hydrogen atom or a methyl group, $R^2$ is a methyl group, an ethyl group, a propyl group or a butyl group, Ar is a substituted or unsubstituted phenylene group, X is —CO—, and m and n are individually an integer not less than 1.

8. The radiation-sensitive composition according to claim 6, wherein the molar ratio of said $ArOXR^2$ group to said ArOH group in said copolymer is 2:98 to 50:50.

9. The radiation-sensitive composition according to claim 7, wherein the molar ratio of said $ArOXR^2$ group to said ArOH group in said copolymer is 2:98 to 50:50.

10. A resist film comprising a base film coated with a composition according to claim 1.

11. A resist film comprising a base film coated with a composition according to claim 2.

12. A method of obtaining a pattern comprising selectively exposing the resist film of claim 10, and developing the resist film to obtain a pattern.

13. A method of obtaining a pattern comprising selectively exposing the resist film of claim 11, and developing the resist film to obtain a pattern.

14. The composition according to claim 1, wherein X is —$SO_2$—.

15. The composition according to claim 2, wherein X is —$SO_2$—.

16. The composition according to claim 1, wherein X is —CO—.

17. The composition according to claim 2, wherein X is —CO—.

18. The composition according to claim 1, wherein the copolymer (a) is selected from the group consisting of a copolymer of 4-methylsulfonyloxystyrene and 4-hydroxystyrene, a copolymer of 4-ethylsulfonyloxystyrene and 4-hydroxystyrene, a copolymer of 4-propylsulfonyloxystyrene and 4-hydroxystyrene, a copolymer of 4-butylsulfonyloxystyrene and 4-hydroxystyrene, a copolymer of 4-methylcarbonyloxystyrene and 4-hydroxystyrene, a copolymer of 4-ethylcarbonyloxystyrene and 4-hydroxystyrene, and a copolymer of 4-butylcarbonyloxystyrene and 4-hydroxystyrene.

19. The composition according to claim 2, wherein the copolymer (a) is selected from a group consisting of copolymer of 4-methylsulfonyloxystyrene and 4-hydroxystyrene, a copolymer of 4-ethylsulfonyloxystyrene and 4-hydroxystyrene, a copolymer of 4-propylsulfonyloxystyrene and 4-hydroxystyrene, a copolymer of 4-butylsulfonyloxystyrene and 4-hydroxystyrene, a copolymer of 4-methylcarbonyloxystyrene and 4-hydroxystyrene, a copolymer of 4-ethylcarbonyloxystyrene and 4-hydroxystyrene, and a copolymer of 4-butylcarbonyloxystyrene and 4-hydroxystyrene.

\* \* \* \* \*